(12) United States Patent
Boriskin et al.

(10) Patent No.: US 11,079,523 B2
(45) Date of Patent: Aug. 3, 2021

(54) DEVICE AND METHOD FOR SHIELDING AT LEAST ONE SUB-WAVELENGTH-SCALE OBJECT FROM AN INCIDENT ELECTROMAGNETIC WAVE

(71) Applicant: InterDigital CE Patent Holdings, Paris (FR)

(72) Inventors: Artem Boriskin, Cesson-Sevigne (FR); Mitra Damghanian, Cesson-Sevigne (FR); Laurent Blonde, Thorigné-Fouillard (FR)

(73) Assignee: InterDigital CE Patent Holdings, Paris (FR)

( * ) Notice: Subject to any disclaimer, the term of this patent is extended or adjusted under 35 U.S.C. 154(b) by 167 days.

(21) Appl. No.: 16/342,080

(22) PCT Filed: Oct. 20, 2017

(86) PCT No.: PCT/EP2017/076835
§ 371 (c)(1),
(2) Date: Apr. 15, 2019

(87) PCT Pub. No.: WO2018/073407
PCT Pub. Date: Apr. 26, 2018

(65) Prior Publication Data
US 2019/0250315 A1      Aug. 15, 2019

(30) Foreign Application Priority Data

Oct. 21, 2016   (EP) .................... 16306386

(51) Int. Cl.
*G02B 5/28*   (2006.01)
*G02B 5/20*   (2006.01)
*H05K 9/00*   (2006.01)

(52) U.S. Cl.
CPC ........... *G02B 5/203* (2013.01); *H05K 9/0081* (2013.01); *G02B 2207/101* (2013.01); *G02B 2207/121* (2013.01)

(58) Field of Classification Search
CPC ............. G02B 5/203; G02B 2207/101; G02B 2207/121; G02B 1/00; G02B 5/18;
(Continued)

(56) References Cited

U.S. PATENT DOCUMENTS 3,718,383 A   2/1973  Moore
3,873,408 A   3/1975  Hensler
(Continued)

FOREIGN PATENT DOCUMENTS

CN   1452722 A   10/2003
CN   1823456     8/2006
(Continued)

OTHER PUBLICATIONS

Valentine et al. "An Optical Cloak Made of Dielectrics", Nature Materials Letters vol. 8, July, pp. 568-571 (Apr. 29, 2009).
(Continued)

*Primary Examiner* — Arnel C Lavarias
(74) *Attorney, Agent, or Firm* — nvention Mine LLC

(57) ABSTRACT

A device for shielding a sub-wavelength-scale object from an electromagnetic wave incident on the device. The device includes a layer of dielectric material, a surface of which has a change of level forming a step. The step is in contact with a medium having a refractive index that is lower than a refractive index of the dielectric material. The sub-wavelength-scale object is located within the device in a quiet zone where an electromagnetic field intensity is below a threshold, the quiet zone extending above said surface, in a vicinity of the step, in a direction of incidence of said incident electromagnetic wave.

20 Claims, 9 Drawing Sheets

(58) Field of Classification Search
CPC ............... G02B 2005/1804; G02B 5/1809;
G02B 5/28; G02B 5/285; H05K 9/0081;
B82Y 20/00; B82Y 99/00
USPC ............... 359/589, 558, 577, 580, 601, 896;
977/832, 834, 902, 932, 952, 963
See application file for complete search history.

(56) References Cited

U.S. PATENT DOCUMENTS

| | | | |
|---|---|---|---|
| 3,904,268 A | 9/1975 | Keck | |
| 4,952,037 A | 8/1990 | Oikawa | |
| 6,236,513 B1 | 5/2001 | Mallary | |
| 6,569,575 B1 | 5/2003 | Biebuyck | |
| 6,594,430 B1 | 7/2003 | Rausch | |
| 6,753,131 B1 | 6/2004 | Rogers | |
| 6,804,189 B2* | 10/2004 | Inase | G11B 7/00745 369/275.3 |
| 7,057,151 B2* | 6/2006 | Lezec | G01Q 60/22 250/216 |
| 7,394,535 B1 | 7/2008 | Chen et al. | |
| 7,541,115 B1 | 6/2009 | Volk | |
| 7,612,883 B2 | 11/2009 | Que | |
| 8,003,965 B2 | 8/2011 | Grbic et al. | |
| 8,052,908 B2 | 11/2011 | Peckerar | |
| 8,448,247 B2 | 5/2013 | Stute | |
| 8,488,247 B2 | 7/2013 | Cai et al. | |
| 8,508,830 B1 | 8/2013 | Wang | |
| 8,552,416 B2 | 10/2013 | Kim et al. | |
| 8,554,031 B2 | 10/2013 | Astratov | |
| 8,953,064 B1 | 2/2015 | Ng et al. | |
| 9,151,891 B2 | 10/2015 | Ma | |
| 9,170,203 B2 | 10/2015 | Bisht | |
| 9,389,424 B1 | 7/2016 | Schowengerdt | |
| 10,677,992 B2* | 6/2020 | Boriskin | G02B 5/1814 |
| 10,678,127 B2* | 6/2020 | Boriskin | G03F 7/7035 |
| 10,846,835 B2* | 11/2020 | Gill | G02B 27/46 |
| 2003/0036674 A1 | 2/2003 | Bouton | |
| 2008/0024792 A1 | 1/2008 | Pendry et al. | |
| 2008/0089367 A1 | 4/2008 | Srinivasan | |
| 2008/0231863 A1 | 9/2008 | Chen | |
| 2009/0068597 A1 | 3/2009 | Shiraishi | |
| 2010/0006784 A1 | 1/2010 | Mack et al. | |
| 2010/0067842 A1 | 3/2010 | Seidman | |
| 2010/0265590 A1 | 10/2010 | Bowers | |
| 2010/0320213 A1 | 12/2010 | Kelly | |
| 2010/0320513 A1 | 12/2010 | Goarin | |
| 2011/0063717 A1 | 3/2011 | Consonni | |
| 2012/0326309 A1 | 12/2012 | Andry | |
| 2013/0308127 A1 | 11/2013 | Bisht | |
| 2013/0335677 A1 | 12/2013 | You | |
| 2014/0043611 A1 | 2/2014 | Narasimhan | |
| 2014/0111677 A1 | 4/2014 | Fukuda | |
| 2014/0333926 A1 | 11/2014 | Bond | |
| 2015/0090862 A1 | 4/2015 | Matsui | |
| 2015/0146180 A1 | 5/2015 | Lee | |
| 2015/0177619 A1 | 6/2015 | Kobrin | |
| 2015/0212242 A1 | 7/2015 | Chen | |
| 2015/0243096 A1 | 8/2015 | Schowengerdt | |
| 2015/0248790 A1 | 9/2015 | Schowengerdt | |
| 2015/0268415 A1 | 9/2015 | Schowengerdt et al. | |
| 2016/0084761 A1 | 3/2016 | Rothberg | |
| 2016/0147138 A1 | 5/2016 | Shih | |
| 2016/0187788 A1 | 6/2016 | Onose | |
| 2016/0223739 A1 | 8/2016 | Yoon et al. | |
| 2016/0240419 A1 | 8/2016 | Sieber | |
| 2016/0259253 A1 | 9/2016 | Luo | |
| 2016/0265747 A1 | 9/2016 | Nagao et al. | |
| 2016/0298875 A1 | 10/2016 | Dellea | |
| 2018/0210214 A1* | 7/2018 | Kim | B82Y 20/00 |
| 2018/0354844 A1* | 12/2018 | Drazic | C03C 17/001 |
| 2019/0101700 A1 | 4/2019 | Boriskin | |
| 2019/0101769 A1* | 4/2019 | Boriskin | G02B 27/56 |
| 2019/0250315 A1 | 8/2019 | Boriskin | |
| 2020/0233223 A1 | 7/2020 | Shramkova | |

FOREIGN PATENT DOCUMENTS

| | | |
|---|---|---|
| CN | 1853131 | 10/2006 |
| CN | 101088040 | 12/2007 |
| CN | 101419337 A | 4/2009 |
| CN | 101819326 | 9/2010 |
| CN | 102916343 A | 2/2013 |
| CN | 103353675 | 10/2013 |
| CN | 105974576 A | 9/2016 |
| EP | 1398656 A1 | 3/2004 |
| EP | 3223062 | 9/2017 |
| EP | 3223063 A1 | 9/2017 |
| JP | 2005141075 A | 6/2005 |
| JP | 2011014857 A | 1/2011 |
| KR | 20120111288 | 10/2012 |
| RU | 2591282 C1 | 7/2016 |
| WO | 0157559 A1 | 8/2001 |
| WO | 2003025635 A1 | 3/2003 |
| WO | 2008080117 A2 | 7/2008 |
| WO | 2010114834 A1 | 10/2010 |
| WO | 2010114857 A1 | 10/2010 |
| WO | 2014182893 A1 | 11/2014 |
| WO | 2017007431 | 1/2017 |
| WO | 2017162880 | 9/2017 |
| WO | 2017162881 | 9/2017 |
| WO | 2017162882 | 9/2017 |
| WO | 2018073407 A1 | 4/2018 |
| WO | 2018073426 A1 | 4/2018 |

OTHER PUBLICATIONS

Mukuwa et al. "A full-color eyewear display using planar waveguides with reflection volume holograms" Journal of the SID, vol. 17, No. 3, pp. 185-193, (May 20, 2008).

Nishiwaki et al. "Efficient colour splitters for high-pixel density image sensors" Nature Photonics, vol. 7, pp. 240-246 (Feb. 3, 2013).

Dang et al. "Red, green and blue lasing enabled by single-exciton gain in colloidal quantum dot films", Nature Nanophotonics Letters, vol. 7, p. 335, (Apr. 29, 2012).

Cai et al. "Optical cloaking with metamaterials", Nature Photonics Letters, vol. 1, pp. 224-227, (Apr. 2, 2007).

Kotylar et al. "Photonic nanojets generated using square-profile microsteps" Applied Optics vol. 53, No. 24 pp. 5322-5329 (Aug. 12, 2014).

Stafeev et al. "Measurement of photonic nanojet generated by square-profile microstep" Proc. of SPIE vol. 9448 94482C-1 (2014).

Martin et al. "Intense Bessel-like beams arising from pyramid-shaped microtips" Optics Letters vol. 37 No. 7 pp. 1274-1276 (Mar. 30, 2012).

Geints et al. "Modeling spatially localized photonic nanojets from phase diffraction gratings" Journal of Applied physics 119, 153101 (Apr. 18, 2016).

Minin et al. "Localized EM and photonic jets from non-spherical and non-symmetrical dielectric mesoscale objects: Brief review"— Ann. Phys. 1-7(2015) (Jun. 1, 2015).

Heifetz et al "Photonic nanojets" J Comput Theor Nanosci. Sep. 1, 2009; 6(9): 1979-1992 (Sep. 1, 2009).

Alitalo et al. "Electromagnetic cloaking with metamaterials" Materials Today, vol. 12, No. 3 Mar. 2009 pp. 22-29 (Mar. 2009).

Landy et al. "Guiding light with conformal transformations" Optics Express vol. 17, No. 1 Aug. 17, 2009 pp. 14872-14879 (Aug. 6, 2009).

Monticone et al. "Invisibility exposed physical bounds on passive cloaking" Optica vol. 3, Issue 7 pp. 718-724 (Sep. 14, 2016).

Pendry et al. "Controlling electromagnetic fields" Science Express pp. 1-4 (May 25, 2006).

Schmied et al "Conformal carpet and grating cloaks" Optics Express vol. 18 No. 23 Nov. 8, 2010 pp. 24361-24367 (Nov. 5, 2010).

Pacheco-Pena et al. "Multifrequency focusing and wide angular scanning of terajets" Opt. Lett., vol. 40, No. 2, pp. 245-248, (2015).

Kong et al "Photonic nanojet-enabled optical data storage" Opt. Express, vol. 16, No. 18, Oct. 2008.

(56) References Cited

OTHER PUBLICATIONS

Grbic et al "Near-field plates: subdiffraction focusing with patterned surfaces" Science, vol. 320, Issue 5875 Apr. 25, 2008 pp. 511-513, (Apr. 25, 2008).
Novotny et al. "Near-field optical microscopy and spectroscopy with pointed probes" Annu. Rev. Phys. Chem. vol. 57, pp. 303-331, (Dec. 16, 2005).
Guo et al. "Fabrication of optical fiber probes for scanning near-field optical microscopy" mSURJ, vol. 3, No. 1, pp. 32-39 (Mar. 2008).
Pacheco-Pena et al. "Terajets produced by dielectric cuboids" Applied Phys. Lett. vol. 105, 084102, (Aug. 27, 2014).
Liu et al "Geometric effect on photonic nanojet generated by dielectric microcylinders with non-cylindrical cross-sections" Optics Communications 380 (2016) 287-296 (Jun. 17, 2016).
Boriskina "Spectrally engineered photonic molecules as optical sensors with enhanced sensitivity: a proposal and numerical analysis" J. Opt. Soc. Am. B vol. 23, No. 8/Aug. 2006 1565 (Mar. 28, 2006).
Liu et al. "Photonic nanojet modulation by elliptical microcylinders"—Optik 125 (2014) 4043-4046 (Jan. 15, 2014).
Abdul Khaleque et al. "Tailoring the properties of photonic Nanojets by Changing the Material and Geometry of the Concentrator" Progress in Electromagnetics Research Letters, vol. 48, 7-13, 2014 (Aug. 8, 2014).
Mahariq et al. "Photonic Nanojet Analysis by Spectral Element Method", IEEE Photonics Journal, vol. 6, No. 5, 6802714 Oct. 2014 (Oct. 7, 2014).
Geints et al. "Influence of the spatial shape of nonspherical symmetric dielectric microparticles on morphology of photonic jets" Proc. of SPIE vol. 9680 96800V-1 (2015).
Geints et al. "Characteristics of photonic nanojets from ordered microassemblies of dielectric spheres" Quantum Electronics 46 (3) 236-241 (Jan. 15, 2016).
Matsui et al. "Finite-difference time-domain analysis of photonic nanojets from liquid-crystal-containing microcylinder", Japanese Journal of Applied Physics 53, 01AE04 (2014) (Dec. 31, 2013).
Hua et al. "A 3D integral imaging optical seethrough head-mounted display" Opt. Express, vol. 22, 13484, Jun. 2, 2014 (May 28, 2014).
Gu, Yinghong, et. al., "Color Generation Via Subwavelength Plasmonic Nanostructures". Nanoscale, vol. 7, (2015), pp. 6409-6419.
Matsui, Takayuki, et. al., "Transmission Phase Control by Stacked Metal-Dielectric Hole Array With Two-Dimensional Geometric Design". Optical Society of America, Optical Express, vol. 20, No. 14, Jul. 2, 2012, pp. 16092-16103.
International Search Report and Written Opinion of the International Searching Authority for PCT/EP2017/057129 dated May 30, 2017, 12 pages.
International Preliminary Report on Patentability for PCT/EP2017/057129 dated Sep. 25, 2018, 9 pages.
International Search Report and Written Opinion of the International Searching Authority for PCT/EP2017/057131 dated May 30, 2017, 12 pages.
International Preliminary Report on Patentability for PCT/EP2017/057131 dated Sep. 25, 2018, 9 pages.
Ghenuche, Petru, et. al., "Multi-Focus Parallel Detection of Fluorescent Molecules At Picomolar Concentration With Photonic Nanojets Arrays". Applied Physics Letters, American Institute of Physics, (2014), vol. 105, No. 13, pp. 13031102-1-13031102-5.
Kress, Bernard, et. al., "A Review of Head-Mounted Displays (HMD) Technologies and Applications for Consumer Electronics". Proceedings of SPIE, vol. 8720, (2013), pp. 87200A-1-87200A-13.
Tirosh, Udi, "New Flat Lenses Technology Could Offer Smaller Lenses With Zero Chromatic Aberration". DIY Photography, Feb. 20, 2015, 8 pages.
Khorasaninejad, Mohammadreza, et. al., "Metalenses: Versatile Multifunctional Photonic Components". Planar Optics, Science, vol. 358, No. 1146, Dec. 1, 2017, pp. 1-8.
Liu, Cheng-Yang, "Photonic Jets Produced by Dielectric Micro Cuboids". Applied Optics, vol. 54, Issue 29, (2015), pp. 8694-8699.
Liu, Cheng-Yang, "Ultra-High Transmission of Photonic Nanojet Induced Modes in Chains of Core-Shell Microcylinders". Physics Letters A, vol. 376, (2012), pp. 3261-3266.
Wei, Pei-Kuen, et. al., "Diffraction-Induced Near-Field Optical Images in Mesoscale Air-Dielectric Structures". Journal of Optical Society of America, vol. 20, No. 7, Jul. 2003, pp. 1503-1507.
Pacheco-Pena, V., et. al., "Terajets Produced by 3D Dielectric Cuboids". Applied Physics Letters vol. 105, No. 8, (2014), pp. 1-12.
International Search Report and Written Opinion of the International Searching Authority for PCT/EP2017/057130, dated Jun. 26, 2017, 11 pages.
International Preliminary Report on Patentability for PCT/EP2017/057130, dated Sep. 25, 2018, 7 pages.
Stafeev, S., et. al., "Near-Field Diffraction of Laser Light by Dielectric Corner Step". Proceedings of SPIE, vol. 9031, (2014) pp. 90311A-1-90311A-7.
Huang, Fu Min, et. al., "Nanohole Array as a Lens". Nano Letters, vol. 8, No. 8., (2008), 8 pages.
Junesch, Juliane, et. al., "Optical Properties of Nanochole Arrays in Metal-Dielectric Double Films Prepared by Mask-On-Metal Colloidal Lithography". ACS Nano, vol. 6, No. 11, (2012), pp. 10405-10415.
Minin, Igor V., et. al., "Localized Photonic Jets from Flat, Three-Dimensional Dielectric Cuboids in the Reflection Mode". Optics Letters, vol. 40, No. 10, May 15, 2015, pp. 2329-2332.
Wikipedia, "Diffraction". Wikipedia web article retrieved from the internet on May 16, 2017, pp. 1-14.
Liu, Cheng-Yang, "Ultra-Elongated Photonic Nanojets Generated by a Graded-Index Microellipsoid". Progress in Electromagnetics Research Letters, vol. 37, (2013), pp. 153-165.
Royon, Arnaud, "Nonlinear Femtosecond Near Infrared Laser Structuring In Oxide Glasses", Electronic Theses and Disserations, (2009), 174 pages.
Sinai, P., "Correction of Optical Aberrations by Neutron Irradiation". Applied Optics, vol. 10, Issue 1, Jan. 1971, pp. 99-104.
Machine translation of RU 2591282 C1 published on Jul. 20, 2016, 5 pages.
Liu, Cheng-Yang, et. al., "Engineering Photonic Nanojets by Core-Shell Micro-Cuboids". IEEE Proceedings of the 16th international Conference on Nanotechnology, Aug. 22-25, 2016, pp. 113-115.
Kong, Soon-Cheol, et. al., "Quasi One-Dimensional Light Beam Generated by a Graded-Index Microsphere". Optical Society of America, Optics Express, vol. 17, No. 5, Mar. 2, 2009, pp. 3722-3731.
International Preliminary Report on Patentability for PCT/EP2017/076881 dated Apr. 23, 2019, 6 pages.
International Search Report and Written Opinion of the International Searching Authority for PCT/EP2017/076881 dated Feb. 2, 2018, 10 pages.
Venugopal, Gunasekaran, et. al., "Advances in Micro/Nano Electromechanical Systems and Fabrication Technologies". Chapter 8, entitled "Nanolithography", Intech Press, (2013), pp. 187-205.
Xie, X.N., et. al., "Nanoscale Materials Patterning and Engineering by Atomic Force Microscopy Nanolithography". Materials Science and Engineering R54, (2006), pp. 1-48.
Wu, Wei, et. al., "A Deep Sub-Wavelength Process for the Formation of Highly Uniform Arrays of Nanoholes and Nanopillars". Nanotechnology, vol. 18, 485302, (2007), pp. 1-4.
Cheung, Chin Li, et. al., "Fabrication of Nanopillars by Nanosphere Lithography". Nanotechnology, vol. 17, No. 5, Mar. 14, 2006, pp. 1339-1343.
Xu, Chen, et. al., "Photon Nanojet Lens: Design, Fabrication and Characterization". Nanotechnology, vol. 27, Mar. 4, 2016.
Mohseni, Hooman, "Photonic Jet and its Applications in Nano-Photonics". Frontiers in Optics/Laser Science (2015), 2 pages.
Voison, Pauline, "New Generation Lithography by UV-Assisted Nanoimprint: Study and Development of Materials and Processes for Microelectronic Application". Abstract of PhD Thesis, Universete Joseph Fourier, (2007), 173 pages.
Yu, Geints, et. al., "Modeling Spatially Localized Photonic Nanojets From Phase Diffraction Gratings". Journal of Applied Physics, vol. 119, No. 15, 153101, Apr. 21, 2016, pp. 153101-1-153101-6.

(56) References Cited

OTHER PUBLICATIONS

Kim, Jooyoung, et al., "Fabrication of Palsmonic Nanodiscs by Photonic Nanojet Lithography". Applied Physics Express, vol. 5, 025201, Jan. 19, 2012, pp. 025201-1-025201-3.

Kushwaha, P.K., et al., "Controlled Shaping of Photonic Nanaojets Using Core Shell Microspheres". International Conference on Optics and Photonics, Proceedings of SPIE, vol. 9654, (2015), pp. 96541H-1-6.

Timoschenko, Igor, "Scanning Nanaojet Lithograph and Microscope". Photonics Applications in Astronomy, Communications, Industry, and High-Energy Physics Experiments, Proceedings of SPIE vol. 6937, 69373R (2007), pp. 69373R-1-69373R-5.

International Search Report and Written Opinion of the International Searching Authority for PCT/EP2017/076877, dated Jan. 17, 2018, 11 pages.

International Preliminary Report on Patentability for PCT/EP2017/076877 dated Apr. 23, 2019, 7 pages.

International Search Report and Written Opinion of the International Searching Authority for PCT/EP2017/076835, dated Jan. 23, 2018, 19 pages.

International Preliminary Report on Patentability for PCT/EP2017/076835 dated Apr. 23, 2019, 10 pages.

\* cited by examiner

DEVICE AND METHOD FOR SHIELDING AT LEAST ONE SUB-WAVELENGTH-SCALE OBJECT FROM AN INCIDENT ELECTROMAGNETIC WAVE

This application claims the benefit, under 35 U.S.C. § 365 of International Application PCT/EP2017/076,835, filed Oct. 20, 2017, which was published in accordance with PCT Article 21(2) on Apr. 26, 2018, in English and which further claims the benefit of priority application EP16306386.0, filed on Oct. 21, 2016.

1. TECHNICAL FIELD

The present disclosure relates to a technique for shielding objects from electromagnetic waves. More precisely, it relates notably to techniques for shielding objects which dimensions are smaller than the wavelength of incident electromagnetic waves, also called sub-wavelength-scale objects, from such electromagnetic waves.

Such techniques find application in a wide range of domains, such as displays (TV smartphones, tablets), augmented reality (AR) glasses, digital image sensors, etc.

2. BACKGROUND

This section is intended to introduce the reader to various aspects of art, which may be related to various aspects of the present disclosure that are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

In the optical field, the today level of technologies enables fabrication of highly-integrated components (e.g. chips and optical sensors) with structural elements having nano-scale dimensions, which are close to or even smaller than the wavelength of visible light (see for example the article "*A full-color eyewear display using planar waveguides with reflection volume holograms*" by H. Mukawa et al., published in the proceedings of SID, vol. 17, no. 3, pp. 185-193, 2009, or the article "*Efficient colour splitters for high-pixel density image sensors*" by S. Nishiwaki et al., published in Nature Photonics, vol. 7, pp. 240-246, 2013, or in the document US 2014/0111677, or in the article "*A 3D integral imaging optical see-through head-mounted display*" by H. Hua and B. Javadi, published in Opt. Express, vol. 22, 13484, 2014).

As an example, quantum dots (QD) are nanometer-sized core-shell semiconductor crystals, usually ranging between 2 nm and 20 nm in diameter. Their optoelectronic properties vary as a function of size, shape, and material composition. In particular, quantum dots with a diameter ranging from about κ to 12 nm can emit light of different colors covering the full visible spectrum from blue to red color. Commercially available quantum dots are generally made of cadmium selenide/zinc sulfide (CdSe/ZnS) structures, where the CdSe forms the core and the ZnS shell functions as luminescence stabilizer for the quantum dot.

One of the key features of a QD is its ability to absorb light in a wide electromagnetic spectrum, while producing monochromatic light at a given wavelength controlled by the parameters of the quantum dot, as described by C. Dang et al., in "*Red, green and blue lasing enabled by single-exciton gain in colloidal quantum dot films*", published in Nature Nanophotonics 7, 335, 2012. The ability of QDs to precisely convert and tune a spectrum find application in QD-LCD displays (for "Quantum Dot—Liquid Crystal Displays") enabling a more energy-efficient and more balanced lighting, as explained by C. You et al. in the patent document US 2013/0335677 A1.

Quantum dots also find application in a new generation of organic light-emitting diode (OLED) displays, so called QD-LED or QLED displays, as described in patent documents U.S. Pat. No. 8,552,416 B2 and U.S. Pat. No. 8,508,830 B1. The structure of a QLED is similar to the OLED technology with a quantum dot light-emitting layer sandwiched between layers of electron-transporting and hole-transporting organic materials. An applied electric field causes electrons and holes to move into the quantum dot layer, where they are captured by quantum dots and recombine, emitting photons. Unlike QD-LCD display, QLED displays do not require backlighting, which makes them much thinner and lighter. Like OLED, QLED can be fabricated using optically-transparent materials, which makes them potentially suitable for AR glasses and transparent flat-panel TV screens.

Quantum dots may support large, flexible displays and would not degrade as readily as OLEDs, theoretically making them good candidates for flat-panel TV screens, digital cameras, and mobile devices.

The QD display is an emerging display technology considered as a possible alternative to LCD and OLED display technology. It would be similar to organic light-emitting diode (OLED) displays, in that light would be supplied on demand, which would enable more efficient displays.

However, a potential problem which may arise with QD displays lies in a possible spontaneous excitation of quantum dots by ambient light. It can be of particular importance for transparent displays and especially for augmented reality glasses that can be exposed to direct sun light. To avoid this problem, it would be helpful to be able to shield quantum dots from light (e.g. ambient light) coming from a certain direction (for example to shield quantum dots from ambient light, while keeping their ability to be excited by light coming from a determined light source direction).

Moreover, the ability of angular-selective filtering of light incident on quantum dots would enable selective excitation of QDs by different integrated light sources. This could be of peculiar interest for displays and light emitting devices, whose operational principles rely on the use of two or more sources of illumination. For example, an eyewear display of AR glasses could be simultaneously illuminated by two (or more) micro-projectors transmitting a decomposed digital image. Other applications could be found in a flat-panel TV display with a transparent screen exposed by ambient light from behind or a non-transparent display comprising at least two independent integrated light sources, e.g. two projectors used to selectively illuminate individual pixels.

Despite these numerous use case scenarios, in which angular-selective shielding, or excitation, on quantum dots would be useful, this technical problem has not been addressed so far in the state of the art.

Nowadays, a commonly used method for protecting transparent displays from ambient light is based on using smart glass, which is a type of technical glass which light transmission properties are altered when voltage, light or heat is applied. Generally, the glass changes from transparent to translucent enabling filtering of some (or all) wavelengths incident on this glass.

The smart glass often used in glasses is a photochromic glass changing its transparency upon exposure to light based on the reversible transformation of a chemical species between two forms by the absorption of electromagnetic radiation, where the two forms have different absorption spectra.

This approach is effective for dynamic protection of displays from ambient light (dynamic here means variable as a function of an external stimulus, e.g. intensity of incident light) but is not suitable for a static angular-selective shielding of some objects (e.g. QDs) from incident electromagnetic waves.

There also exists a technique for hiding objects from electromagnetic waves, called metamaterial cloaking, which is based on the use of metamaterials to form an invisibility cloak. By cloaking, it is meant the ability to reconstruct the wave front of an electromagnetic wave incident on a finite-size object making this object invisible for an observer. Metamaterial cloaking, based on transformation optics, describes the process of shielding an object from view by controlling electromagnetic radiation. Objects in a cloaked location are still present, but incident waves are guided around them without being affected by the object itself. Metamaterial cloaking is for example described by W. Cai et al. in "*Optical cloaking with metamaterials*", published in Nature Photonics, vol. 1, pp. 224-227, 2007 or in patent document U.S. Pat. No. 8,488,247 B2.

However, effectiveness of this concept is limited because of difficulties with practical realization of 3D metamaterials (MM), i.e. artificial materials with specific electromagnetic properties enabling a so-called negative refraction. Actually, there is a lack of natural bulk materials having a negative refraction index necessary for enabling the cloaking phenomenon, as well as certain difficulties with realization of artificial materials (i.e. metamaterials) with the desired electromagnetic properties.

In principle, metamaterials can be made from assemblies of multiple elements fashioned from composite materials such as metals or plastics. The materials are usually arranged in repeating patterns, at scales that are smaller than the wavelengths of the phenomena they influence. Metamaterials derive their properties not from the properties of the bulk materials, but from their newly designed structures. Their precise shape, geometry, size, orientation and arrangement give them their smart properties capable of manipulating electromagnetic waves: by blocking, absorbing, enhancing, or bending waves, to achieve benefits that go beyond what is possible with conventional materials.

However, realization of the optical metamaterials is very challenging. Moreover, electromagnetic properties of metamaterials are usually strongly dependent on the wavelength of the incident electromagnetic wave, which reduces their attractiveness for the applications requiring a wideband cloaking.

An alternative approach for creating invisible cloaking based on pure dielectric structures and the transformational optics approach was described by R. Schmied et al., in "*Conformal carpet and grating cloaks*," published in Opt. Express 18(23), 24361, 2010. However, this approach implies significant variation of the refraction index value that is not feasible in the optical range due to the limited range of index variation for optically-transparent materials. In other words, cloaking in the visible spectrum has not been achieved yet.

Finally, J. Valentine et al., in "*An optical cloak made of dielectrics*", published in Nature Materials 8, 568, 2009, reports on a dielectric cloak created using the effective permittivity approach, which implies reduction of the effective index of a bulk dielectric material by creating holes with a variable size and/or density. This concept requires creation of a large number of holes with a well-controlled size/shape and layout, which may be associated with certain technological difficulties. It can be implemented only for 2D planar structures. Such a solution cannot be generalized for 3D structures.

In summary, state of the art solutions for shielding (cloaking) objects from electromagnetic fields show several drawbacks, and do not appear as appropriate solutions for angular-selective shielding of individual sub-wavelength-scale elements, such as quantum dots for example, or other types of nanoscale objects, or sub-wavelength-scale parts of larger objects.

It would hence be desirable to provide a new technique for shielding sub-wavelength-scale objects, or sub-wavelength-scale parts of larger objects, from incident electromagnetic waves, and notably for providing angular-selective shielding of such objects or parts in the visible spectrum, which would not suffer from these drawbacks.

3. SUMMARY OF THE DISCLOSURE

References in the specification to "one embodiment", "an embodiment", "an example embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The present disclosure is directed to a device for shielding at least one sub-wavelength-scale object from an electromagnetic wave, which is incident on said device.

Such a device is remarkable in that it comprises:
at least one layer of a dielectric material, a surface of which having at least one abrupt change of level forming a step, and
a medium having a refractive index lower than that of said dielectric material, which is in contact with at least a lower and lateral part of said surface with respect to said step.

Moreover, within such a device, at least one sub-wavelength-scale object is located in a quiet zone where an electromagnetic field intensity is below a threshold, said quiet zone extending above said surface, in the vicinity of said step, in a direction of incidence of said electromagnetic wave.

In a variant, it is proposed a device for shielding at least one sub-wavelength-scale object from an electromagnetic wave with a given wavelength (i.e. a monochromatic electromagnetic wave), which is incident on said device according to a propagation direction. The at least one sub-wavelength-scale object is sensitive to an electromagnetic wave, and the device comprises:
at least one layer of a dielectric material, a surface of which having at least one abrupt change of level forming a step, and
a medium having a refractive index lower than that of said dielectric material, which is in contact with at least a lower and lateral part of said surface with respect to said step,
and the at least one sub-wavelength-scale object is located within said device in a quiet zone that is a zone where an electromagnetic field intensity within a diffracted near-field pattern is below a threshold related to an electromagnetic sensitivity of the at least one sub-wavelength-scale object. The quiet zone extends above the surface, in the vicinity of the step, in a same direction to the propagation direction of the incident electromagnetic wave.

In a variant, the at least one sub-wavelength-scale object is sensitive to an electromagnetic wave in such way that it can be excited by the electromagnetic wave. Once excited, the at least one sub-wavelength-scale object can emit also another electromagnetic wave. Hence, in response to an excitation by an electromagnetic wave, the at least one sub-wavelength-scale object can become an emitter.

In another variant, the at least one sub-wavelength-scale object is sensitive to an electromagnetic wave in such way that it can be degraded or altered.

According to the present disclosure, a sub-wavelength-scale object may either be an object with sub-wavelength-scale dimensions (i.e. nanoscale dimensions for optical wavelengths), or a sub-wavelength-scale part of a larger object. For example, such a sub-wavelength-scale object may be a portion of a long thin object such as a nanowire or interconnect line. It may also be an edge of an object, which could produce strong undesirable scattering and/or back reflection. In other words, the terms "sub-wavelength-scale object" used throughout the present document also encompass a part of an object, which part has sub-wavelength dimensions in at least one cut plane.

Hence, the present disclosure provides a new type of device for angular-selective shielding of sub-wavelength-scale objects, with the aid of a purely dielectric microstructure. Actually, unlike smart glass, which operational principle relies on dynamic changes of the bulk material properties, this new type of device uses standard dielectric materials (like optically-transparent glass, plastics, polymers, etc.) and a diffraction phenomenon associated with microstructural elements embedded in the bulk material.

Actually, when used at optical wavelengths, such a device may produce at least one condensed optical beam in the near zone (i.e. a nanojet beam), thus creating at least one high-intensity focal spot in an imaging plane, which is defined in the near zone of the device. As a corollary to the generation of a nanojet beam, there also appears a quiet zone in the near zone of the device, where an electromagnetic field intensity is below a threshold. The use of such a device is of course not limited to optical wavelengths.

The notion of "quiet zone" is well known in antenna theory, and is usually used in relation to so-called compact antenna test range facilities and geographical zones with zero radiofrequency signal level. It is also used in the above-mentioned prior art technique of metamaterial cloaking, where it is defined as a zone where the wave amplitude is small. The notion of "quiet zone", as used throughout this document, is derived by analogy with the definitions given in the antenna theory and in the electromagnetics/optics field, and must be interpreted as a zone where an electromagnetic field intensity is below a threshold, i.e. a zone where the electromagnetic field intensity is low enough for the sub-wavelength-scale object to be considered as shielded from the electromagnetic wave. The level of the threshold may thus depend on the type of sub-wavelength-scale object, and the reason why it should be shielded from the EM wave, i.e. on the potential application. For example, such threshold can have a value that is 10 times lower than the field intensity of the incident wave.

The present disclosure takes advantage of the creation of such local quiet zones inside the bulk material to hide one or several sub-wavelength-scale objects from electromagnetic waves having a certain wavelength, or in a certain wavelength range.

More precisely, the abrupt change of level in the surface induces a step of index for an incident electromagnetic wave, which reaches the device in the vicinity of the step in the dielectric layer. Such a step of index gives birth to a complex electromagnetic phenomenon, which will be described in greater detail in relations to the figures in the foregoing disclosure. Such a complex electromagnetic phenomenon, which involves diffraction of the incident wave on the lower part of the edge with respect to the step, coupled to refraction of the diffracted wave on the lateral part of the step allows producing condensed beams and quiet zones and thus different field patterns in an imaging plane located in the near zone, depending on the features of the step, and on the ratio of refractive indexes between the dielectric material and the medium covering its lower and lateral surfaces.

The medium in contact with the lower and lateral surfaces of the step may simply be air, another gas, vacuum, a liquid or any other material with a refractive index lower than that of the dielectric material. It must also be noted that the lateral part of the step need not necessarily be vertical, and may show an angle with respect to the normal to the surface of the dielectric layer. Moreover, it may not necessarily be a straight-line segment.

There is no restriction on the bottom surface of the dielectric layer, which may be plane, or not. The dielectric layer may notably be flexible.

As will be described in more details in the foregoing, the location of the quiet zone will notably depend on the angle of incidence of the electromagnetic wave on the bottom surface of the device. As a consequence, it is possible to achieve an angular-selective shielding of the sub-wavelength-scale object(s), by shielding the object(s) from electromagnetic waves incident from a certain direction.

Compared to metamaterial cloaking methods, the devices according to the present disclosure provide a specific optical function, i.e. shielding (which is different from metamaterial invisible cloaking) that may be of interest for QD-display technology and other optical applications that require shielding sub-wavelength-scale objects from electromagnetic waves.

Moreover, such devices may be manufactured according to standard micro-fabrication technologies, such as, for instance, photolithography and nano-imprinting, thus allowing a simple and low-cost implementation of the proposed technique in various devices.

According to an embodiment of the present disclosure, said step is formed by an edge of at least one cavity made in said at least one layer of dielectric material.

Hence, as compared to a single step in the layer of dielectric material, all the edges of the cavity may contribute to generating a field intensity distribution in the near zone, notably producing one or several quiet zone(s) inside which sub-wavelength-scale objects may be hidden, or shielded, from incident EM waves. Depending on the shape of the cavity cross-section, such contributions may combine to produce different field patterns.

According to another embodiment, said quiet zone extends partially inside said at least one cavity and above said at least one cavity in said direction of incidence of said electromagnetic wave.

Hence, as the location of the quiet zone depends on the direction of incidence of the electromagnetic wave, such a device achieves angular-selective shielding of the object(s), which may be hidden, or shielded, from EM (for Electro- Magnetic) waves coming from a given direction, but not from EM waves coming from another one.

In a particular embodiment of the present disclosure, said at least one cavity belongs to at least one set of at least two cavities.

Cavities may be arranged into arrays of cavities, or non-regular arrangements forming a peculiar pattern, potentially in 3D, in order to generate specific focused beams and corresponding quiet zones in the near zone, or an array of beams and quiet zones. An array of two or more closely positioned cavities can be used in order to provide control over the field distribution in a larger area and/or to shield sub-wavelength-scale object(s) from electromagnetic waves coming from several distinct directions of incidence. Moreover, the arrays of cavities may be planar (with all base faces of all cavities laying in the same plane) or not, and can be made of identical cavities or not. In case of an array, each cavity acts independently creating a quiet zone in its own shadow region.

According to an embodiment of the present disclosure, said at least one cavity is targeted to be cylindrical or cone-shaped.

By cylindrical cavity, it is meant here, and throughout this document, a cavity which shape is a generalized cylinder, i.e. a surface created by projecting a closed two-dimensional curve along an axis intersecting the plane of the curve. In other words, such a cylinder is not limited to a right circular cylinder but covers any type of cylinder, notably, but not exclusively, a cuboid or a prism for example. The cavity may also have the form of a cone. Its main axis may be orthogonal to the surface of the bottom of the cavity, or be tilted. Due to the fabrication tolerance, the cavities may also have imperfect shapes, and it must be understood, for example, that cavities targeted to be shaped as cylinders, may become cone-shaped cavities with S-shape cross-sections during the manufacturing process.

More generally, such cavities are formed as cylinders or cones with an arbitrary cross-section, which can be adapted (optimized) in order to produce a desired near-field pattern, i.e. a desired field intensity distribution in the xy-plane (typically orthogonal to the incident wave propagation direction). This pattern may have one or multiple hot spots and quiet zones with identical (or different) field intensity level.

According to another embodiment of the present disclosure, a dimension of said at least one cavity, in said direction of incidence of said electromagnetic wave, and in any direction orthogonal to said direction of incidence of said electromagnetic wave, is between a fraction of a wavelength of said electromagnetic wave in said dielectric material and a few wavelengths of said electromagnetic wave in said dielectric material.

Actually, the dimensions of the cavity in the horizontal plane (i.e. the plane orthogonal to the propagation direction of the incident wave) are directly related to the dimensions of the quiet zone which appears, or is created. In order to shield a sub-wavelength-scale object, or part of an object, the size of the quiet zone must be about one wavelength in the medium inside the cavity, or in the host medium if the quiet zone occurs in the shadow region behind the cavity. The length of the quiet zone along the step is defined by the length of the step. In case of a cylindrical cavity showing two opposite edges, a recommended dimension of the cavity in the orthogonal plane is about one to two wavelengths. If it becomes significantly larger than that, a unique deep quiet zone may be replaced by two smaller quiet zones, each associated with its own step index discontinuity.

In another embodiment of the disclosure, the step is formed by an edge of at least one groove made in said at least one layer of dielectric material.

According to another embodiment of the present disclosure, such a device further comprises at least one layer forming a substrate abutting said at least one layer of dielectric material.

Such a substrate may contribute to the mechanical rigidity of the device.

According to a further embodiment, such a device further comprises at least one layer forming a superstrate, said at least one layer of dielectric material being located between said substrate and said superstrate.

Hence, the device may take the form of a planar optically-transparent element, comprising two glass or plastic plates (namely the substrate and the superstrate), between which a dielectric material with void or filled hollow microcavities is embedded. The superstrate may of course be non-planar, and follow the shape of the substrate for example. Actually, the pattern of the field intensity distribution generated by the device when illuminated by a plane wave incident normal to the base solely depends on the cavity base angle (or step angle), on the cavity cross-section shape, and on the index ratio between the dielectric material and the medium filling the cavity (or covering the lower part of the surface with respect to the step).

It must be noted that the radiation of the beams will change for incline incidence of the plane wave, with a shape of the beam and of the quiet zone well preserved for the incident angles of about +/−30°, depending on the size, base angle and curvature of the cavity edge line.

The sub-wavelength-scale objects may be located in the close vicinity of the cavities, in their shadow region, or even inside the cavities. In other words, sub-wavelength-scale objects may be integrated in the layer of dielectric material, or located in the microcavities, or partially in both.

According to an embodiment, said substrate and said superstrate are made of the same dielectric material as said at least one layer of dielectric material.

According to an embodiment, said dielectric material forming said at least one layer of dielectric material belongs to the group comprising:
glass;
plastic;
a polymer material, such as PMMA (Poly(methyl methacrylate)) or PDMS (Polydimethylsiloxane);
an organic or inorganic optically transparent conductive oxide, such as indium tin oxide (ITO) or doped zinc oxide (ZnO) for example.
ceramics, which may advantageously be used in the microwave range.

It must be noted that air is not considered as a candidate dielectric material for the device according to the present disclosure.

In all of these dielectric materials, no plasmonic effect can occur.

In one embodiment of the disclosure, said at least one layer of dielectric material is a Transparent conducting films (TCFs).

Such a device can hence be fabricated using standard dielectric materials, which are easy to find and inexpensive.

According to an embodiment, a material of said superstrate and/or said substrate belongs to the group comprising:
glass;
plastic;
a polymer material;
a semiconductor material;

an organic or inorganic optically transparent electrically conducting material, such as indium tin oxide (ITO) or doped zinc oxide (ZnO) for example.

a liquid;

a gas;

a gel.

Hence, no plasmonic effect can occur in said superstrate and/or said substrate.

According to a further embodiment, said sub-wavelength-scale object belongs to the group comprising:

a quantum dot;

a plasmonic particle;

a fluorescent dye;

an organic element;

a nanostructure (including for example interconnect lines in a form of nanowires and nanotubes).

Such sub-wavelength-scale objects may hence be active ones, i.e. objects which are capable of absorbing and/or re-emitting EM radiation at the same or at a different wavelength, compared with the incident wave; they may also be passive ones, which are capable of scattering light. Actually, there may be a need to shield some passive elements, e.g. some metallic wires or edges resulting in strong scattering and/or back-reflection, or some components (e.g. made of graphene) that can be sensitive to incident light.

Shielding plasmonic nanoparticles or dye-doped polymers finds interesting applications in the field of displays. There may also be some medical or research applications for shielding organic elements, such as virus, bacteria or antibody, from incident light. In the field of digital optical sensors, it may also be interesting to shield nanowires from incident light by placing them in a quiet zone.

The present disclosure also relates to a method for shielding a sub-wavelength-scale object from an electromagnetic wave, which comprises:

manufacturing at least one layer of a dielectric material, a surface of which having at least one abrupt change of level forming a step, placing at least a lower and lateral part of said surface with respect to said step in contact with a material having a refractive index lower than that of said dielectric material, locating at least one sub-wavelength-scale object in a quiet zone where an electromagnetic field intensity is below a threshold, said quiet zone extending above said surface, in the vicinity of said step, in a direction of incidence of said electromagnetic wave.

It is to be understood that both the foregoing general description and the following detailed description are exemplary and explanatory and are not restrictive of the invention, as claimed.

4. BRIEF DESCRIPTION OF THE DRAWINGS

Embodiments of the present disclosure can be better understood with reference to the following description and drawings, given by way of example and not limiting the scope of protection, and in which.

Figure 4:
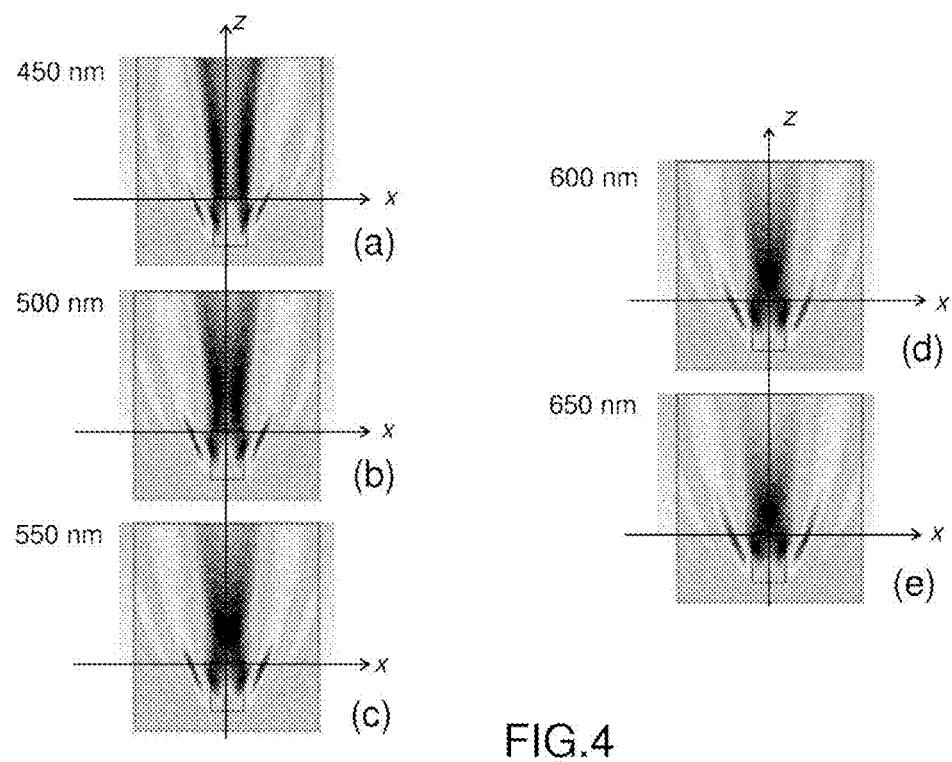
FIGS. 4a to 4e illustrate the formation of a nanojet beam and of a quiet zone by the cavity of FIG. 3 having a circular cylinder shape when illuminated by a plane wave from below at different wavelengths, in the xz plane.
Figure 5:
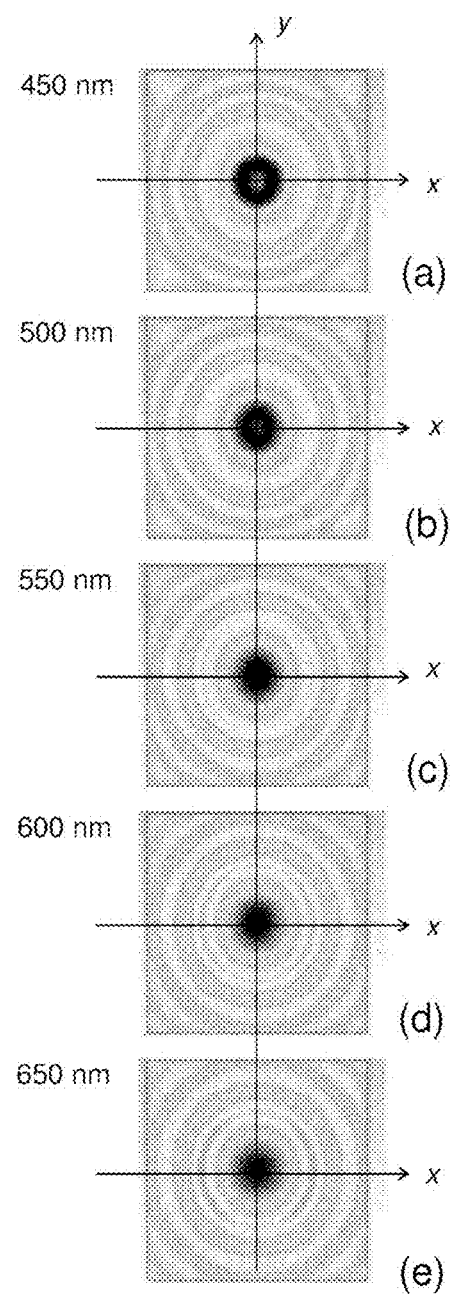
FIGS. 5a to 5e illustrate the formation of a nanojet beam and of a quiet zone by the cavity of FIG. 3 having a circular cylinder shape when illuminated by a plane wave from below at different wavelengths, in the xy plane.
Figure 6A:
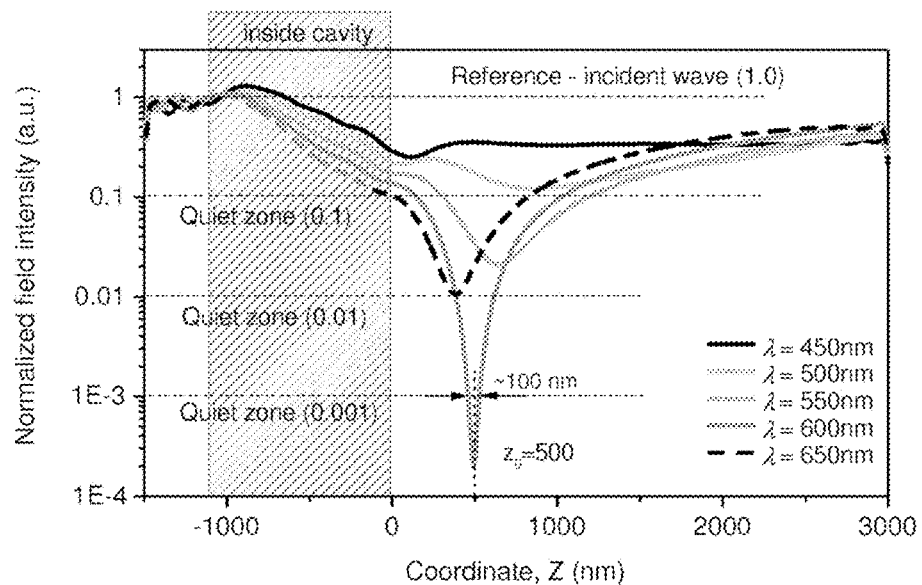
Figure 6B:
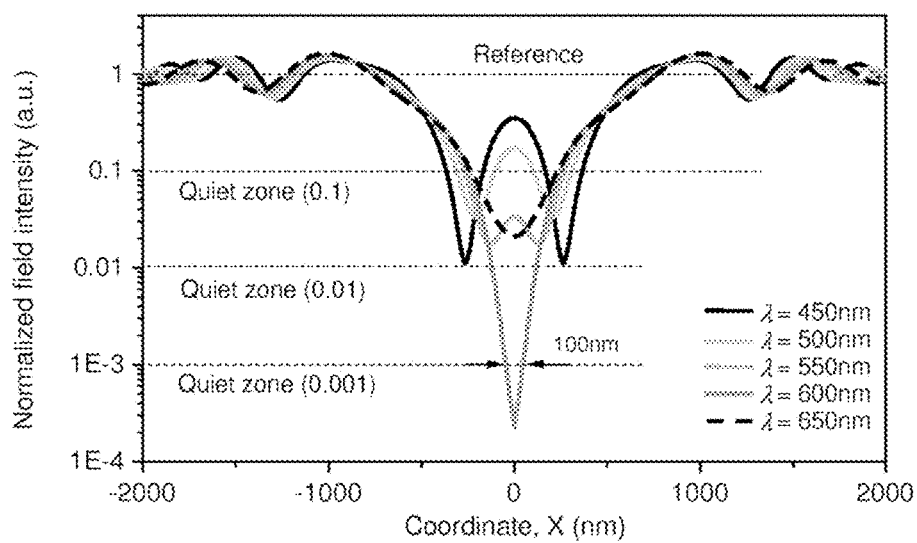
Figure 7A:
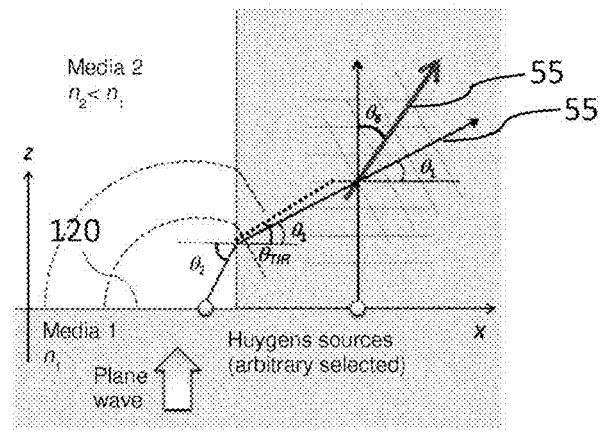
Figure 7B:
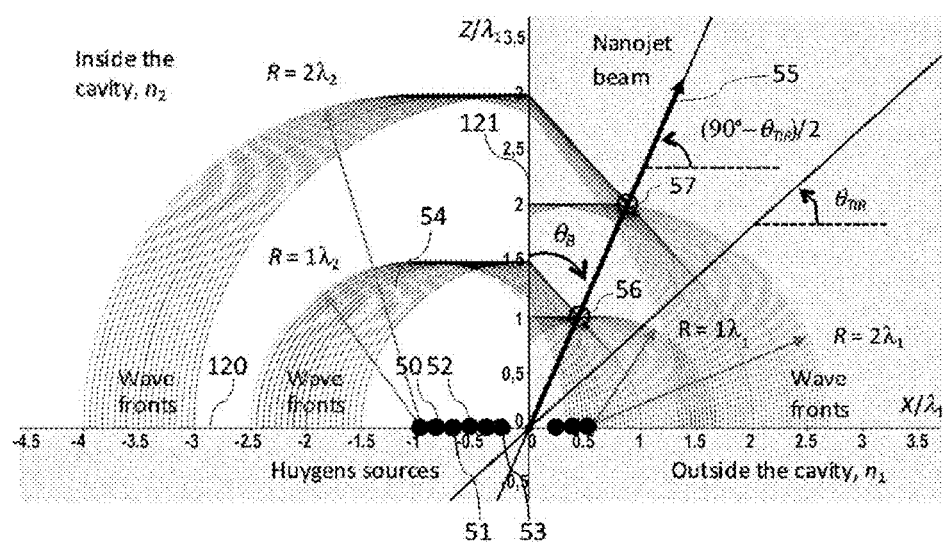
Figure 8:
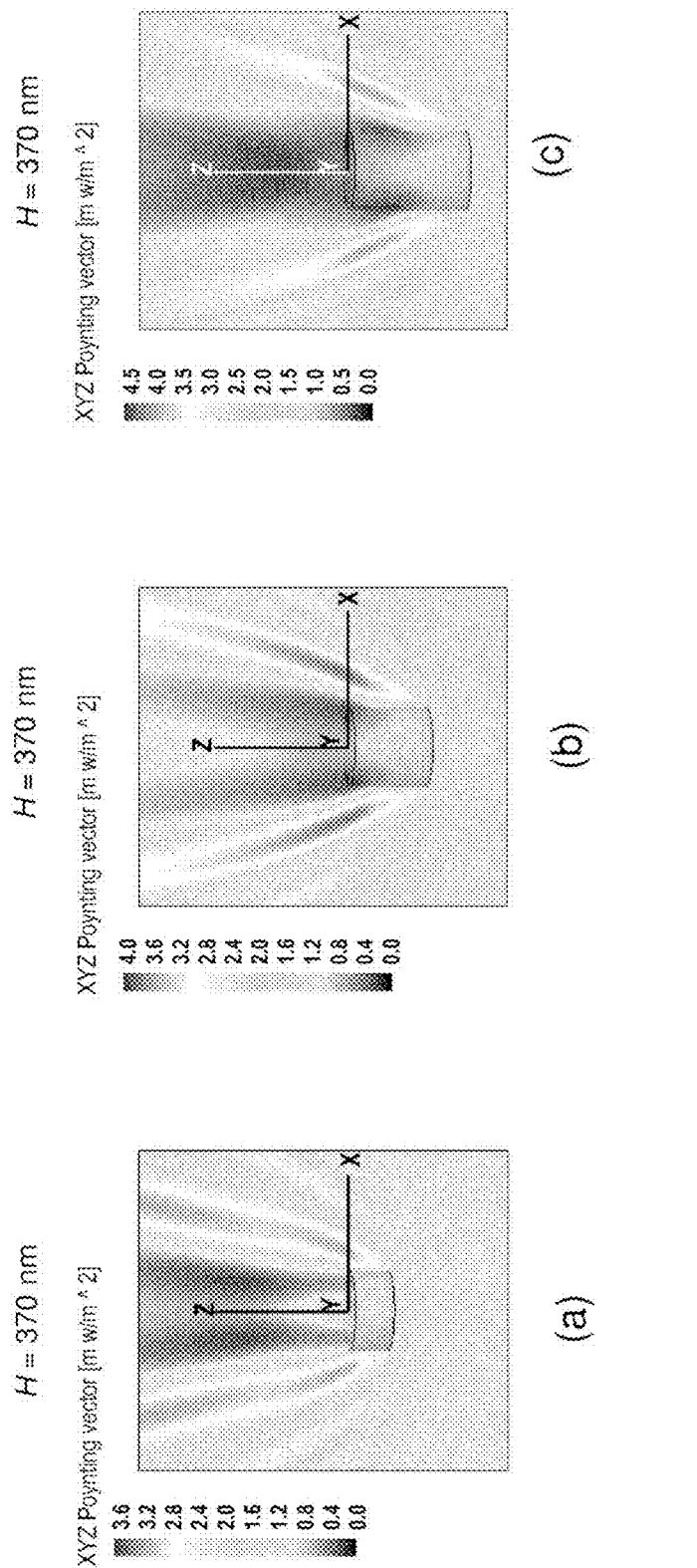
Figure 10:
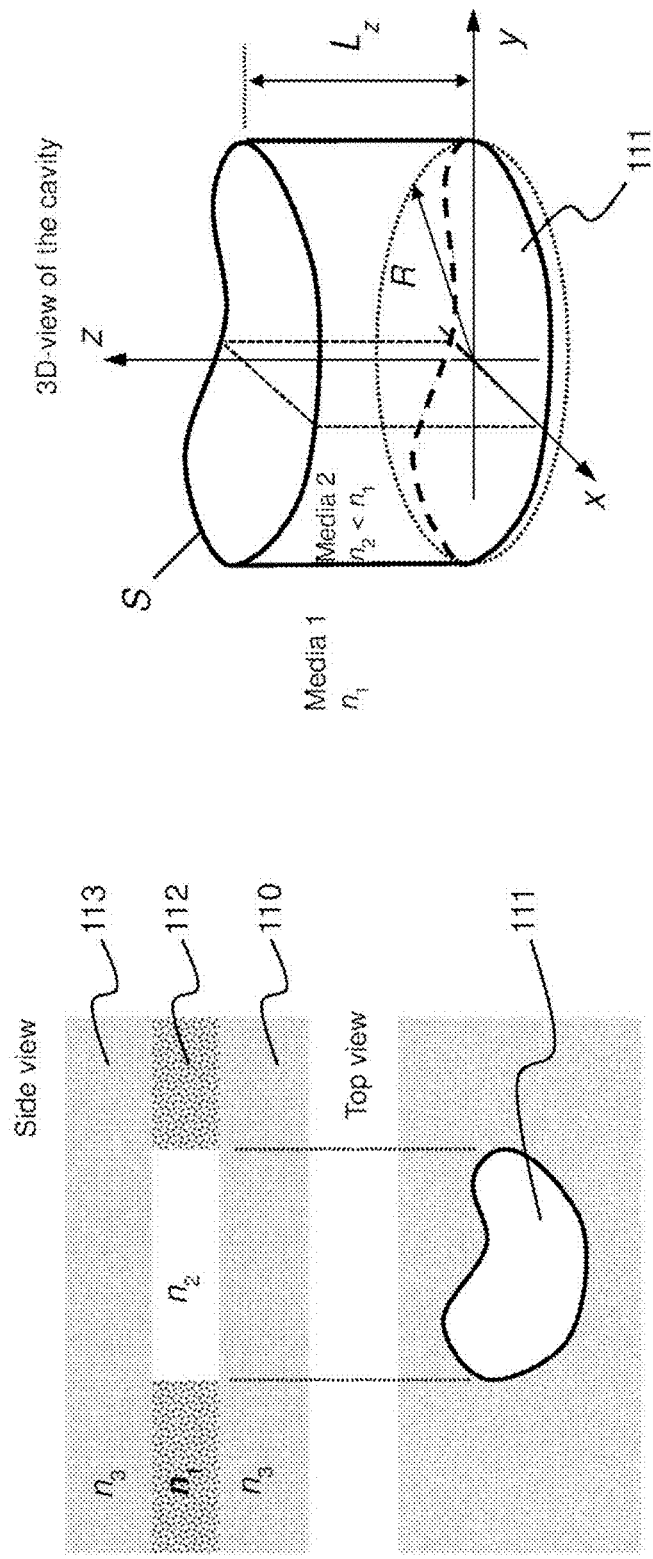
Figure 13:
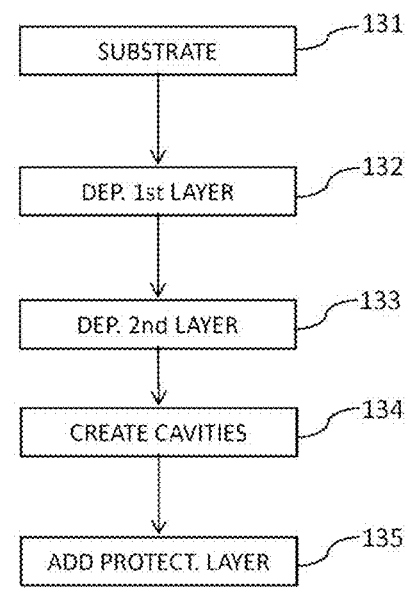
Figure 12:
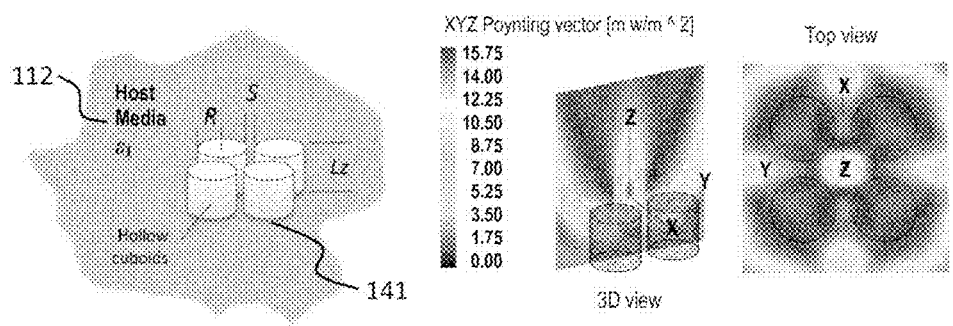

FIGS. 6a and 6b present the line profiles of the field intensity distribution along the vertical and horizontal planes, at the different wavelengths of FIGS. 4 and 5;

FIGS. 7a and 7b illustrate the complex electromagnetic phenomena underlying embodiments of the present disclosure;

FIGS. 8a to 8c illustrate near-field maps of nanojet beam and quiet zones produced by circular cylindrical cavities of different heights when illuminated by a unit-amplitude plane wave from below according to embodiments of the present disclosure;

FIGS. 9a to 9d show nanojet beams and complementary quiet zones produced by a hollow circular cylindrical cavity under different angles of incidence of the unit-amplitude plane wave in XZ-plane (top row) and a section in XY plane (bottom row);

FIG. 10 provides a schematic drawing for the implementation of a component according to an embodiment of the present disclosure;

FIGS. 11a to 11f illustrate side views of alternate embodiments to the component of FIG. 10;

FIG. 12 illustrates a specific embodiment of the present disclosure, according to which the component for shielding sub-wavelength-scale objects is based on a 2×2 planar array of identical hollow circular cylinder cavities embedded in a host medium;

FIG. 13 provides a block diagram of a method for manufacturing a device for shielding sub-wavelength-scale objects according to an embodiment of the present disclosure.

The components in the figures are not necessarily to scale, emphasis instead being placed upon illustrating the principles of the invention.

5. DETAILED DESCRIPTION

The general principle of the present disclosure relies on the design of a new dielectric microstructure, which may be used for shielding sub-wavelength-scale objects, or sub-wavelength-scale parts of larger objects, from electromagnetic waves incident on the microstructure from a given direction and within a given wavelength range. Its use is not limited to optical wavelengths. A step of refractive index in the dielectric microstructure gives rise to a diffraction phenomenon, which is in turn coupled to refraction and interference phenomena, and allows generating both quiet zones, in which the electromagnetic field intensity is below a threshold, and condensed beam(s) of radiation in the near zone when the dielectric microstructure is illuminated by a plane wave, depending on the shape and dimensions of the structure.

By placing the sub-wavelength-scale objects in a quiet zone, it is thus possible to shield them from incident electromagnetic waves. The formation of one or several quiet zone(s) and nanojet beam(s) in the near zone appears with a plane (or locally plane) wave incident on the device.

It may be controlled by setting the step's edge line length and curvature, as well as its base angle and the refractive index of the dielectric material.

Such a general principle allows designing new components, which can be of interest for transparent QD-displays and other QD-based devices, which operation requires preventing QDs from an occasional and unwanted excitation by electromagnetic (EM) waves incident on the device from a given direction—from the sun, or from any light, possibly intense, in the environment. Such components may of course also be used for shielding other types of sub-wavelength-scale objects, either active ones (e.g. ODs, plasmonic particles, dyes) or passive ones (e.g. nanowires) made of any material (e.g. dielectric, metal, semiconductor, graphene) that need to be hidden from EM waves, whatever their wavelength.

Such components may find applications in the field of displays (TV, smartphones, tablets) and augmented reality (AR) glasses, as well as in other domains such as digital image sensors.

The following discussion mostly focuses on optical applications and thus refers to material properties and fabrication methods relevant to nanoscale structures and wavelength. Nevertheless, the proposed design concepts can be easily scaled to other wavelength ranges, including microwaves, mm-waves, THz, IR, visible light and UV.

Inventors of the present disclosure have reached the conclusion that diffraction of a plane electromagnetic wave on the base surface of a dielectric material in the close vicinity of an abrupt change of level of this surface, also called a step, can result in the formation of condensed optical beams (so-called nanojets), when the surface on which diffraction occurs is in contact with a substance (material or gas) having a lower refractive index than that of the dielectric material. The number of beams and shape of each individual beam can be controlled by the variation of the step size and shape of the step edge line adjacent to the lateral and lower surfaces of the step. Formation of one or several quiet zones, in which the EM field intensity is low, in the near-zone, appears complementarily to the formation of nanojet beam(s).

FIGS. 1 to 7 allow understanding the physical phenomena explaining how sub-wavelength-scale objects may be hidden, or shielded, from incident EM waves according to the present disclosure.

Figure 1:
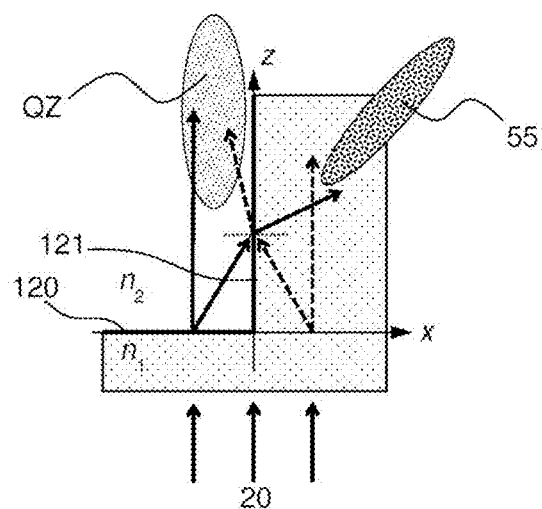
FIG. 1 is a schematic drawing explaining formation of both a nanojet beam and a quiet zone produced by a dielectric layer with a step according to an embodiment of the present disclosure.

FIG. 1 illustrates an embodiment of the present disclosure, where an abrupt change occurs in the level of the surface of a dielectric layer 112, thus forming a step in the layer, which comprises a horizontal, or lower part 120 and a lateral part 121 (which may also be tilted with respect to the z-axis). FIG. 1 shows a side view of the dielectric layer 112.

As shown in FIG. 1, the device is illuminated by an incident wave 20, coming from the base of the device and orthogonal to the base surface of the dielectric layer 112, along the z-axis.

As will be explained in greater detail in relation to FIG. 7, combined interference and diffraction phenomena induce formation of a nanojet beam 55 (i.e. a focused beam of a conical shape directed outside the cavity, towards the denser medium), along with a complementary quiet zone QZ with a low field intensity level inside and behind the step zone.

Figure 2:
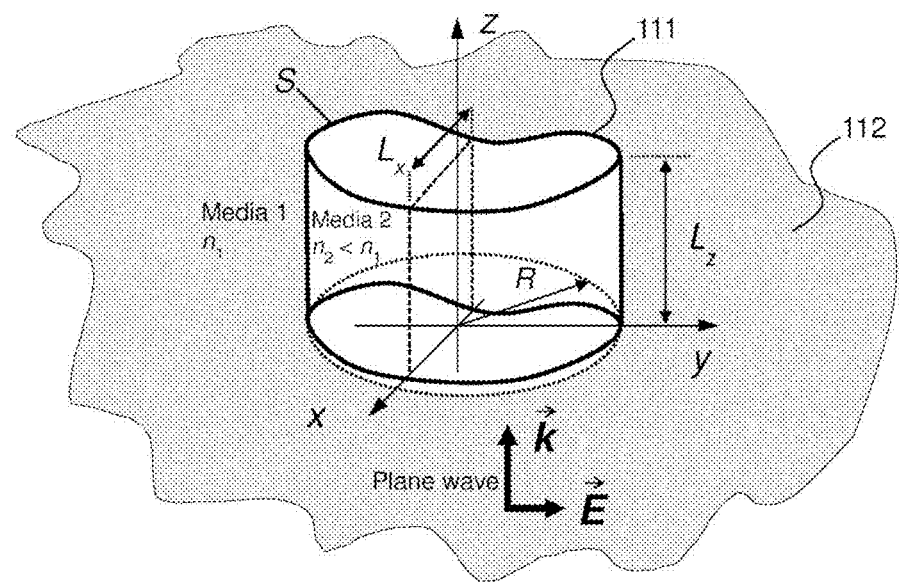
FIG. 2 illustrates the topology of a microcavity formed in a layer of dielectric material according to an embodiment of the present disclosure.

FIG. 2 illustrates an embodiment of the present disclosure, according to which the step formed at the surface of a layer of dielectric material is in fact the edge of a microcavity 111 made in the layer of dielectric material 112. The present disclosure is of course not limited to such an embodiment, and any abrupt change of level and index close to the surface of the dielectric material is sufficient for generating the physical phenomena, which will be described hereafter. Such a step can indeed be considered as the edge of a cavity of infinite size compared to the wavelength.

For sake of simplicity, we therefore focus hereafter on the example of a microcavity 111 formed in the layer of dielectric material 112, like the one illustrated in FIG. 2.

As may be observed, such a cavity is cylindrical, with a cross-section of arbitrary shape. By cylindrical cavity, it is meant here, and throughout this document, a cavity which shape is a cylinder, i.e. a surface created by projecting a closed two-dimensional curve along an axis intersecting the plane of the curve. In other words, such a cylinder is not limited to a right circular cylinder but covers any type of cylinder, notably, but not exclusively, a cuboid or a prism for example.

As may be observed, the cavity is immersed in a host medium Media 1 112 of refractive index $n_1$, and is void or filled with a material (air, gas, liquid, polymer material . . . ) Media 2 of refractive index $n_2$, such that $n_2 < n_1$.

For example, the cavity has a form of a circular cylinder filled in with vacuum ($n_2 \simeq 1$) and embedded in a homogeneous non-dispersive dielectric medium with an example refractive index $n_1 = 1.49$.

Figure 3:
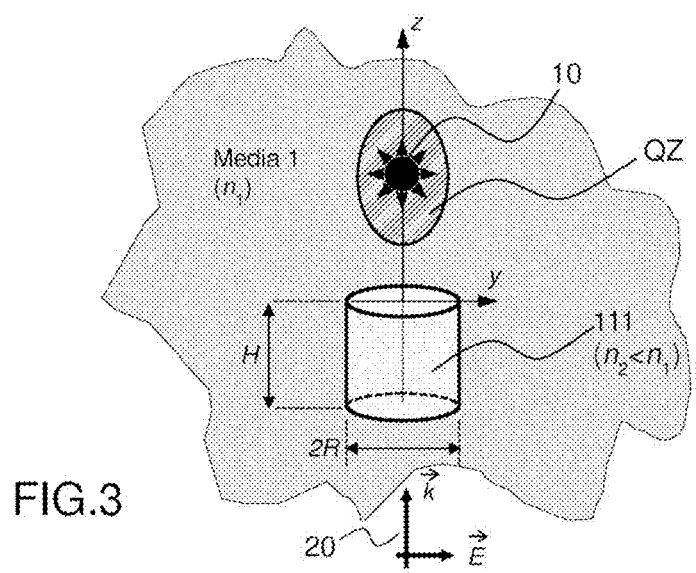
FIG. 3 shows the topology of a device according to an embodiment of the present disclosure, comprising a cylindrical microcavity and an object to be hidden, or shielded.

Such an example is illustrated in FIG. 3, where the cavity 111 has the form of a circular cylinder. For sake of simplicity, it is assumed that the cavity 111 is embedded in an unbounded dielectric medium (uniform, linear, non-dispersive). FIG. 3 gives some notations, which will be used hereafter in the document: the cavity 111 is a circular cylinder with a diameter of 2R, and height H. The plane wave 20 is incident on the bottom of the cavity along the z-axis, hence normal to the base surface of the cylinder. A quiet zone QZ is formed behind the cavity in the direction of propagation of the plane wave 20, and substantially extends along the z-axis. It is located in close vicinity to the cavity 111, and may even (though not illustrated on FIG. 3) extend partially inside cavity 111. One or several sub-wavelength-scale object(s) 10 may be placed in the quiet zone QZ, so as to be hidden, or shielded, from incident EM wave 20.

For example, to this purpose, quantum dots or plasmonic nanoparticles can be embedded in a thin film of an optically-transparent polymer, which fills and/or tops the cavity. In case of organic elements, they may be suspended in a layer of fluid filling the cavity or forming its superstrate.

FIGS. 4 and 5 illustrate the formation of quiet zones, or shadow regions, by such a cavity 111 when illuminated by this plane wave 20. More precisely, FIGS. 4a to 4e each correspond to a different wavelength of the incident electromagnetic wave, namely $\lambda_0 = 450$, 500, 550, 600 and 650 nm, and show near-field maps in the XZ-plane plotted in terms of the time average Poynting vector for the case of a hollow circular cylinder ($n_2 = 1$, R=360 nm, H=1100 nm) embedded in a medium with refractive index $n_1 = 1.5$. The cavity is illuminated by a unit-amplitude $E_y$-polarized plane wave from below, incident along the z-axis ($\theta = 0°$). Position z=0 corresponds to the top surface of the cavity 111. FIGS. 5a to 5e each correspond to a different wavelength of the incident electromagnetic wave, namely $\lambda_0 = 450$, 500, 550, 600 and 650 nm, and show near-field maps in the XY-plane plotted in terms of the time average Poynting vector for the same cavity of FIG. 3. The cut plane for FIGS. 5a to 5e is z=500.

FIGS. 6a and 6b present the line profiles of the field intensity distribution along the vertical and horizontal planes, at the five different wavelengths $\lambda_0$=450, 500, 550, 600 and 650 nm of FIGS. 4 and 5, respectively. Namely, FIG. 6a illustrates the line profiles of the normalized field intensity along z-axis, while FIG. 6b illustrates the line profiles of the normalized field intensity along x-axis at z=500 nm. In FIG. 6a, the hashed zone represents the inside of the cavity. As may be observed, at a given wavelength, a quiet zone with a diameter of about 100 nm, characterized by field intensity suppression by a factor of 1000, can be created. A wider and more stable (in terms of bandwidth) zone can be created for lower field suppression levels. Such a quiet zone can be used, for instance, for shielding one or several QDs (or any other type of sub-wavelength-scale object) from EM waves propagating along z-axis. It must be understood that the acceptable range of attenuation of the field intensity in the quiet zone depends on the foreseen application, as well as on the size of the object to hide or shield. However, in order to efficiently shield sub-wavelength-scale objects, the quiet zone should be at least one wavelength wide.

The origins of the nanojet beams and the complementary quiet zones QZ can be explained by the combination of three electromagnetic phenomena, which occur in the vicinity of the base edge of the hollow cavity (or more generally in the vicinity of the abrupt change of level in the surface of the dielectric material), namely:

diffraction from the index-step discontinuity associated with the base 120 of the cavity (or, more generally with the surface of lower level of a step formed in the host medium), refraction of the diffracted wave at the lateral edge 121 of the cavity (or more generally on the lateral part of the step), interference of the refracted wave leaking out of the cavity and the incident plane wave outside the cavity (or more generally in the host medium), leading to the nanojet beam formation, and interference of the wave leaking inside the cavity and the wave propagating through the cavity (or more generally inside the cavity and in the shadow region behind the cavity), leading to the quiet zone formation.

A schematic drawing illustrating these three phenomena is given in FIGS. 7a and 7b (in addition to what has been previously described in relation to FIG. 1). As in FIGS. 2 and 3, we assume that host media is an optically-transparent non-dispersive dielectric material with a refractive index $n_1$=1.5 (e.g. plastic or glass) and the cavity is filled with vacuum, $n_2$=1. The incident plane wave arrives from below in the diagrams.

The key elements of the complex electromagnetic phenomena illustrated in FIGS. 7a and 7b are the following:

The incident plane wave induces currents at the dielectric-air boundary 120 associated with the cavity base (or more generally when reaching the step of index in the host medium induced by the abrupt change of level in its surface);

These induced currents are considered as Huygens secondary sources 50 to 53;

In line with the diffraction theory, the spherical waves 54 radiated by the Huygens sources cause some power leakage towards the lateral boundary 121 of the cavity;

While crossing the lateral (vertical) boundary, the waves radiated by the Huygens sources experience refraction that causes a tilt of the refracted wave on a certain angle in accordance with the Snell-Descartes's law.

In FIG. 7b, we can notice that outside the cavity the wave fronts coincide for different Huygens source positions along the cavity base line, thus creating a local field enhancement. The planar shape of these fronts evidences for the creation of a directive beam propagating out of the cavity.

Finally, outside the cavity the refracted wave is constructively interfering 56, 57 with the plane wave incident from below giving rise to the nanojet beam 55.

The nanojet beam creation is hence explained by phenomena that are low-dispersive in nature, namely (i) edge diffraction, (ii) refraction of the wave at the interface of two dielectric media, and (iii) interference.

In other words, the nanojet beam 55 is created as a result of the interference of two waves: the first one propagating totally outside the cavity, which preserves the direction and phase velocity of the incident plane wave, and another one that appears as a result of diffraction by the step index discontinuity associated with the base surface of the cavity. The latter wave is faster (due to the lower refractive index of the medium inside the cavity), so when it leaks from the cylinder both constructive and destructive interferences are possible with the first wave depending on the distance from the base of the cylinder and refractive index ratio.

The provided description of the NJ formation phenomenon can also be applied for explaining formation of the quiet zone QZ inside (and behind) the cavity. Actually, the formation of the quiet zone inside and in the shadow region of the cavity may also be explained by the interference between the two waves passing by and passing through the cavity, which acts as a kind of 'negative delay line' for the part of the wave front of the plane wave.

More precisely, and as schematically shown in FIG. 1, the quiet zone is created as a result of a destructive interference between the wave leaking inside through the lateral boundary 121 of the cavity and the secondary wave generated by the Huygens sources 50 to 53 which propagate through the cavity.

The destructive and constructive interferences observed respectively in case of the nanojet NJ beam and quiet zone (CZ) formation are explained by the difference in the phase velocity of the EM waves propagating inside and outside the cavity.

A secondary effect that may also contribute to the formation of the quiet zone is the 180° phase jump of the EM wave reflected from the air-dielectric boundary, which occurs for the wave incident on the vertical boundary from inside the cavity.

Moreover, for the case of a normal incidence of a plane wave on the base of the cavity created in a low-loss dielectric medium, the nanojet beam radiation angle is defined by the Snell's law and, thus, is only a function of two parameters:

(i) ratio between the refraction indexes of the host media and cavity materials, and (ii) the base angle of the prismatic cavity. For sake of simplicity, in the foregoing, we only consider a circular cylinder cavity with the base angle equal to 90° thus having a cylindrical shape with vertical edges.

As follows from FIG. 7b, the main contribution to the formation of the planar wave front of the refracted wave outside the cavity comes from the Huygens sources 50-53 located close to the lateral edge 121 of the cavity. Because of this, the refraction angle of the wave radiated outward the cavity is close to the critical angle for the wave incident on the same boundary from outside (FIG. 7a):

$$\theta_1 \approx \theta_{TIR}, \text{ where } \theta_{TIR}=\sin^{-1}(n_2/n_1) \text{ is the critical angle.} \quad (1)$$

The nanojet beam 55 is finally created as a result of the constructive interference between the refracted wave and the plane wave incident from below, the angle of radiation of the nanojet beam ($\theta_B$) is defined by a vector sum of the two waves as schematically shown in FIG. 7a. These considerations lead one to the following approximate formula for the radiation angle of the nanojet beam:

$$\theta_B \approx (90° - \theta_{TIR})/2 \qquad (2)$$

According to Eqn. (2), in the case of a host medium with index $n_1 = 1.49$ ($\theta_{TIR} =$) 41.8°, the nanojet beam radiation angle should be $\theta_B \sim 24°$ that is slightly larger than observed in the full-wave simulations. This difference is explained by some assumption made in the qualitative analysis. First, this analysis does not take into account the difference in the amplitude of the refracted and incident waves. Second, it does not take into account the rays launched by the Huygens sources located close to the cavity edge from outside that experience the total internal reflection on the cavity lateral edge. Being totally reflected, these rays may also contribute to the formation of the nanojet beam. Note that these two effects are related to the total internal reflection phenomenon. Nevertheless, these both effects (i) depend on the ratio of refraction indexes of the two media and (ii) result in reducing the nanojet radiation angle. Thus, the actual nanojet radiation angle can be smaller than that predicted by Eqn. (2).

FIGS. 8a to 8c illustrate near-field maps of the nanojet beam and quiet zones QZ produced by cylindrical cavities ($n_1 = 1.49$, $n_2 = 1$, R=370 nm) of different heights ((a) H=370 nm, (b) H=740 nm, (c) H=1110 nm) when illuminated by a unit-amplitude plane wave from below. As may be observed, the nanojet phenomenon is well pronounced for the cavity size varying from about one to a few wavelengths in the host medium, namely $½\lambda_1 < H < 3\lambda_1$.

Higher cylindrical cavities (FIG. 8c) tend to generate broader quiet zones, which may be more efficient for hiding sub-wavelength-scale objects.

As shown on FIGS. 8a to 8c, the length of the nanojet beam can vary from a few to several wavelengths in the host medium depending on the cavity shape and size.

Based on the 2-D ray-tracing analysis of FIG. 7b, the main contribution in the formation of the nanojet beam comes from the feeds located close to the cavity lateral edge (or to the lateral part of the step). The corresponding 'effective aperture' responsible for the formation of the nanojet beam is estimated as about one half of the wavelength in the medium inside the cavity (½ $\lambda_2$) that is to be counted from the lateral edge inward the cavity. For the cavity having arbitrary shape, this aperture is to be defined along the line orthogonal to the cavity cross-section boundary, S (see FIG. 2).

FIGS. 9a to 9d show nanojet beams and quiet zones QZ produced by a hollow cylindrical cavity ($n_1 = 1.49$, $n_2 = 1$, H=740 nm, R=370 nm) under different angles of incidence of the unit-amplitude plane wave in XZ-plane, namely $\theta = 0°$ in FIG. 9a, $\theta = 10°$ in FIG. 9b, $\theta = 20°$ in FIG. 9c and $\theta = 30°$ in FIG. 9d.

The symmetry of the near-field patterns in the XY-plane (see FIG. 9a) evidences that the beam shape and radiation angle remain nearly constant for both TE (Transverse Electric) and TM (Transverse Magnetic) polarizations of the incident wave.

Figure 9:
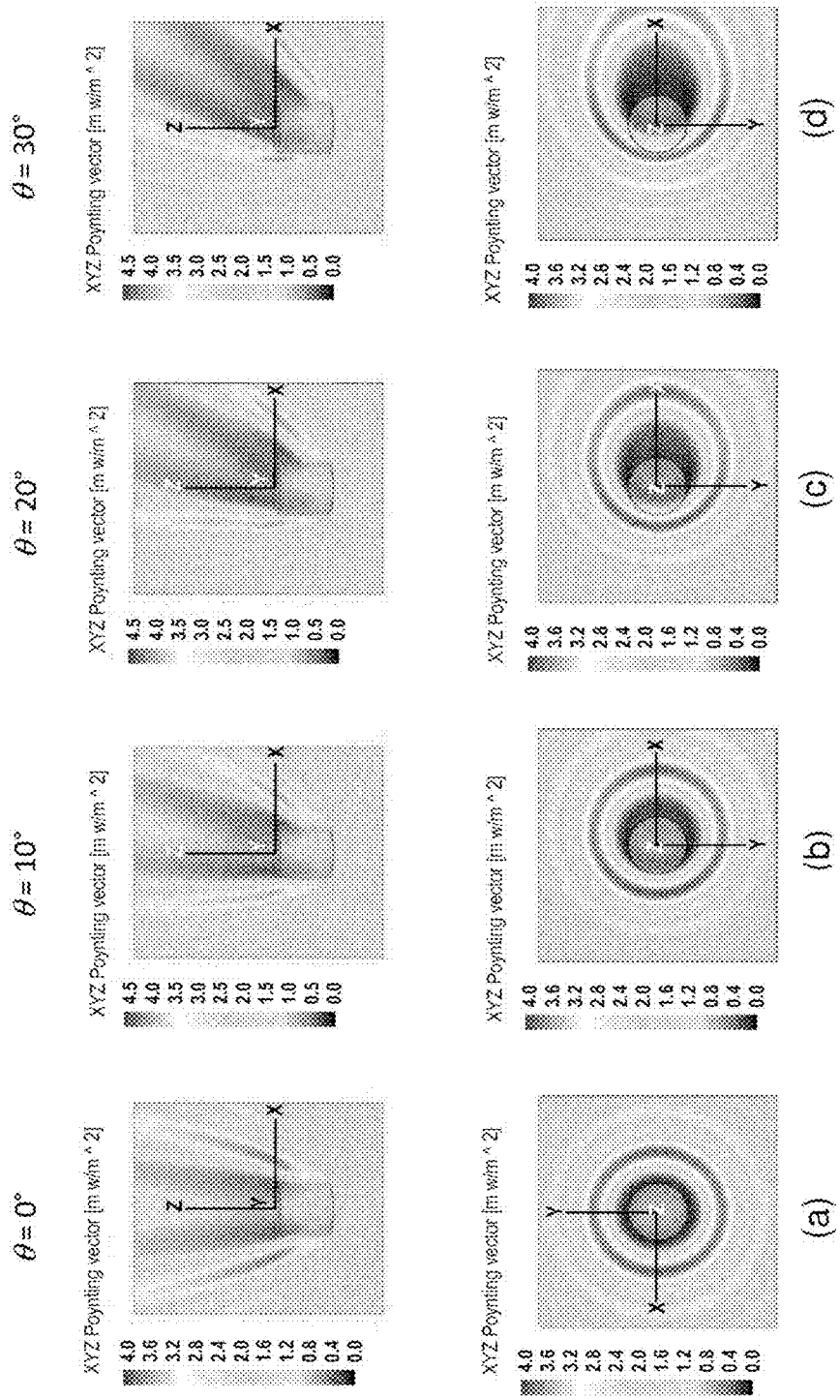

Moreover, in case of an inclined incidence, it may be observed in FIG. 9 that the beam radiation angle changes in correspondence to the angle of incidence of the plane wave. The shape of the beam and field intensity enhancement remain nearly constant for incidence angle up to about $\theta_B$.

Complementarily, the location of the quiet zone with respect to the cavity varies with the angle of incidence of the electromagnetic wave. Depending on the position of the sub-wavelength-scale object which must be shielded, it is thus possible to shield it from electromagnetic waves coming from a certain direction, but not from others. The present disclosure thus allows achieving angular-selective hiding or shielding of sub-wavelength-scale objects.

FIG. 10 provides a schematic drawing for the implementation of a component for shielding sub-wavelength-scale objects according to an embodiment of the present disclosure.

Figure 11:
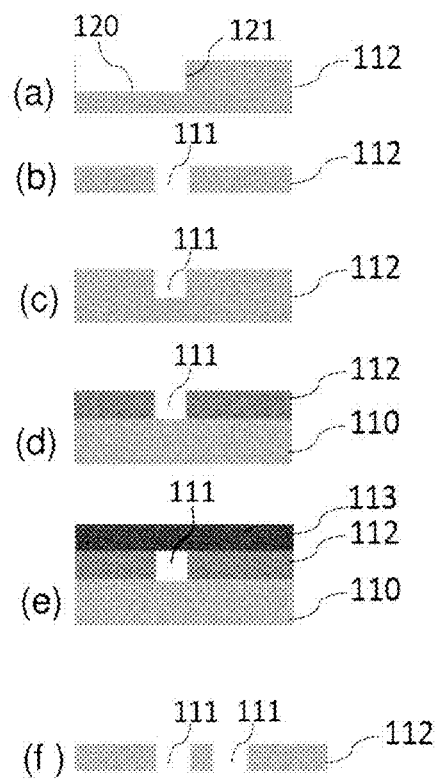

Such a device presents a multi-layer structure comprising:
  a first layer 110 forming a substrate, which may be made in glass or plastic for example;
  a second layer of dielectric material 112 abutting the substrate 110;
  a third layer forming a superstrate 113, on top of the dielectric layer 112. The superstrate may be made in glass or plastic for example. In the embodiment of FIG. 11, the same material is used for the substrate 110 and the superstrate 113, although this is not compulsory.

A cavity 111 of arbitrary cross-section is formed in the layer of dielectric material 112. FIG. 10 offers a 3D-view of the cavity 111, as well as both a side view and a top view of the component.

In an embodiment, the device of FIG. 10 is a planar optically-transparent (e.g. glass) plate with embedded cylindrical micro-cavities oriented to be orthogonal to its surface. Both the substrate 110 and the superstrate 113 are glass plates, and the layer 112 of dielectric material is a thin film made in an optically-transparent polymer like PMMA (Poly (methyl methacrylate)).

FIGS. 11a to 11f illustrate side views of alternate embodiments to the component of FIG. 11.

In FIG. 11a, the component is made of a single layer of dielectric material 112. An abrupt change of the surface level of the layer of dielectric 112 forms a step, which also induces a step of index for an incident wave reaching the component from the bottom, as air surrounding the component has a lower refractive index than the dielectric material 112. Hence, the complex electromagnetic phenomena described above in relation to FIGS. 1 to 7 take birth, first by diffraction of the plane incident wave on the lower, or horizontal, part 120 of the surface, and then by refraction of the diffracted wave on the lateral part 121 of the step.

The component may also be immersed in another material than air, for example another gas, or the lower part 120 of the surface may be in contact with any other material having a lower refractive index than the dielectric material 112.

FIG. 11b illustrates another embodiment, according to which the component comprises a single layer of dielectric material 112, in which is formed a cavity as a through-hole: the height of the cavity thus corresponds to the thickness of the dielectric layer 112.

FIG. 11c illustrates another embodiment, according to which the component comprises a single layer of dielectric material 112, in which is formed a cavity 111, which height is smaller than the thickness of the layer of dielectric material 112. Both the height of the cavity and its cross-section may be arbitrarily chosen, as a function of the number and dimensions of sub-wavelength-scale objects to be hidden by the component, as well as of the incidence direction of the electromagnetic waves from which they must be hidden. Notably, the top of the cavity need not necessarily correspond to the top surface of the dielectric layer 112.

A specific embodiment in which the cavity 111 is of infinite dimensions compared to the wavelength corresponds to the embodiment of FIG. 11a, the step corresponding to an edge of cavity 111.

FIG. 11d illustrates yet another embodiment, according to which the component presents a double-layer structure, namely a first layer 110 forming a substrate, on top of which is placed a second layer 112 of dielectric material. A cavity 111 is formed in the layer 112 of dielectric material. A specific embodiment, where the first layer 110 and the second layer 112 are made in the same material, corresponds to the embodiment of FIG. 11c. It must be noted that two distinct materials may be used for forming the second layer 112 on either side of the cavity 111. For example, a first material may be used for forming the layer 112 on the right side of the cavity, and a second material may be used for forming the layer 112 on the left side of the cavity.

FIG. 11e corresponds to yet another embodiment, in which the device presents a three-layer structure, as in the embodiment of FIG. 10. However, the substrate 110 and the superstrate 113 need not necessarily be made in the same material.

FIG. 11f illustrates yet another embodiment, in which the component comprises a set of two or more cavities formed in the layer of dielectric material. The cavities may be arranged in regular arrays, or grouped in any number and any pattern depending on the beam(s) to be generated. Such multiple cavities may be formed in any of the single-layer or multi-layer embodiments of FIGS. 11b to 11e.

FIG. 12 illustrates a specific embodiment of the present disclosure, according to which the focusing component is based on a 2×2 array of hollow cylinders 141 embedded in a host medium. FIG. 12a illustrates the topology of such a component, while FIG. 12b provides simulation results of the time-averaged power distribution when the component is illuminated by a unit-amplitude plane wave propagating along z-axis ($n_1=1.49$, $L_z=2\lambda_1$, $R=\lambda_1$, $S=0.5\lambda_1$).

The cylindrical shape facilitates manufacturing procedure. In particular, such cylindrical apertures can be fabricated via optical lithography or another established planar micro-fabrication technology, like nanoimprinting or replica molding.

FIG. 13 provides a block diagram of a method for manufacturing a device for shielding sub-wavelength-scale objects according to an embodiment of the present disclosure.

A manufacturing process of such a component, as illustrated in FIG. 10, may consist in:

Step 131: Forming a substrate (e.g. a glass plate 110), which may possibly be a multilayer substrate, possibly with some microstructure elements already deposited via a photolithography technique;

Step 132: Depositing a film of desired thickness on the substrate 110. Such a film may be a layer of a polymer with embedded nanoparticles, ODs, dyes and/or plasmonic particles. There may be various types or sizes of sub-wavelength-scale objects embedded in the film, e.g. three types of QDs with different working wavelength, which may either be distributed uniformly in the layer, or grouped in clusters. In the case of QDs and plasmonic particles, they may be embedded in a thin film of an optically-transparent polymer that is part of the multi-layer structure of a sensor or display. QDs may be grouped in clusters associated with individual pixels of the display or sensor;

Step 133: Depositing a layer 112 of a plastic, glass ($SiO_2$) or another dielectric material;

Step 134: Creating cavities 111 in this film 112 using any established microfabrication technique. They can be created, for instance, by embossing or molding. They can also be created via photolithography or laser or e-beam writing in a layer of a photoresist deposited on the dielectric substrate 112 (e.g. UV/DUV lithography with a mask or direct-write maskless laser etching).

Step 135: Finally, the structure is covered with an additional protective or functional layer (such as a polarization filter, for example), such as another glass plate 113.

Hence, unlike existing analogs, such a component can be fabricated using established planar fabrication technologies, such as, for instance photolithography and nanoimprinting, thanks to its simple topology and availability of dielectric materials with the required refractive index.

In another embodiment of the disclosure, the device for shielding at least one sub-wavelength-scale object is comprised into a display device (such as a quantum dot display device as for example the one depicted in document US2016223739) in order to protect (or shelter) the quantum dots from external electromagnetic waves (due to the lighting in a room for example). These quantum dots are activated by the use of a backlight unit (such as an OLED panel, or a LED matrix backlight or a CCFL (Cold cathode fluorescent lamps) backlight, or a set of fiber scanning units as mentioned in documents US2015243096, U.S. Pat. No. 9,389,424 or US2015268415) and are not perturbed by the external electromagnetic waves.

The invention claimed is:

1. A device for shielding a sub-wavelength-scale object from an electromagnetic wave incident on said device, according to a direction of incidence, said device comprising:
   a layer of dielectric material, a surface of which has a change of level forming a step, said dielectric material having a first refractive index; and
   a medium having a second refractive index that is lower than the first refractive index of said dielectric material, wherein the medium is in contact with said step, and
   wherein said sub-wavelength-scale object is located within said device in a quiet zone extending above said surface, in a vicinity of said step, in a same direction as the direction of incidence of said incident electromagnetic wave.

2. The device of claim 1, wherein said step is formed by an edge of a groove made in said layer of dielectric material.

3. The device of claim 1, wherein said step is formed by an edge of a cavity made in said layer of dielectric material.

4. The device of claim 3, wherein said quiet zone extends partially inside said cavity and above said cavity in the direction of incidence of said incident electromagnetic wave.

5. The device of claim 3, wherein said cavity belongs to a set of at least two cavities.

6. The device of claim 3, wherein said cavity is targeted to be cylindrical or cone-shaped.

7. The device of claim 3, wherein a dimension of said cavity, in the direction of incidence of said incident electromagnetic wave and in any direction orthogonal to the direction of incidence of said incident electromagnetic wave, is between a fraction of a wavelength of said incident electromagnetic wave in said dielectric material and a few wavelengths of said incident electromagnetic wave in said dielectric material.

8. The device of claim 1, wherein said device further comprises a layer forming a substrate abutting said layer of dielectric material.

9. The device of claim 8, wherein said device further comprises a layer forming a superstrate, said layer of dielectric material being between said substrate and said superstrate.

10. The device of claim 9, wherein said layer forming said substrate and said layer forming said superstrate are made of a same dielectric material as that of said layer of dielectric material.

11. The device of claim 10, wherein said dielectric material is selected from the group consisting of: (i) glass, (ii) plastic, (iii) a polymer material, (iv) an organic optically transparent conductive oxide in which plasmonic effect does not occur, and (v) an inorganic optically transparent conductive oxide in which plasmonic effect does not occur.

12. The device of claim 10, wherein a material of one of or more of said superstrate and said substrate is selected from the group consisting of: (i) glass, (ii) plastic, (iii) a polymer material, (iv) a semiconductor material, (v) a liquid, (vi) an organic optically transparent electrically conducting material in which plasmonic effect does not occur, and (vii) an inorganic optically transparent electrically conducting material in which plasmonic effect does not occur, and (viii) a gas.

13. The device of claim 1, wherein said sub-wavelength object is selected from the group consisting of (i) a quantum dot, (ii) a plasmonic particle, (iii) a fluorescent dye, (iv) an organic element, and (v) a nanostructure.

14. The device of claim 1, wherein a plurality of electromagnetic waves is incident on said device, and said quiet zone associated with said device corresponds to a zone being at an intersection of quiet zones associated with said plurality of electromagnetic waves, wherein each of said plurality of electromagnetic waves is associated with a respective wavelength.

15. The device of claim 1, wherein said medium is a vacuum, a solid, a gas, or a liquid.

16. A method for manufacturing a device for shielding a sub-wavelength-scale object from an electromagnetic wave, comprising:
    forming a layer of dielectric material, a surface of which has a change of level forming a step, said dielectric material having a first refractive index;
    placing said step in contact with a medium having a second refractive index lower than that the first refractive index of said dielectric material; and
    locating a sub-wavelength-scale object in a quiet zone above said surface, in a vicinity of said step, in a direction of incidence of an electromagnetic wave.

17. The method of claim 16, wherein said step is formed by forming a cavity in said layer of dielectric material.

18. The method of claim 17, wherein said medium having the second refractive index is present inside said cavity.

19. The method of claim 16, further comprising forming at least one layer making up a substrate, wherein forming said layer of dielectric material includes depositing said layer of dielectric material on said substrate.

20. The method of claim 19, further comprising forming at least one layer making up a superstrate, said layer of dielectric material being formed between said substrate and said superstrate.

* * * * *